United States Patent [19]
Funai et al.

[11] Patent Number: 5,811,327
[45] Date of Patent: Sep. 22, 1998

[54] METHOD AND AN APPARATUS FOR FABRICATING A SEMICONDUCTOR DEVICE

[75] Inventors: Takashi Funai, Tenri; Naoki Makita, Nara; Toru Takayama, Yokohama, all of Japan

[73] Assignees: Sharp Kabushiki Kaisha; Semiconductor Energy Laboratory Co., Ltd.

[21] Appl. No.: 407,609

[22] Filed: Mar. 21, 1995

[30] Foreign Application Priority Data

Mar. 28, 1994 [JP] Japan .................................. 6-057727

[51] Int. Cl.⁶ .......................... H01L 21/00; H01L 21/336
[52] U.S. Cl. .......................... 438/166; 438/308; 438/487
[58] Field of Search .................. 117/10, 904, 8; 148/DIG. 16, DIG. 1, DIG. 3; 437/21, 40 TFT, 174; 257/65; 1/DIG. 3; 438/487, 30, 166, 308

[56] References Cited

U.S. PATENT DOCUMENTS

| | | | |
|---|---|---|---|
| 4,649,624 | 3/1987 | Reedy | 438/59 |
| 5,147,826 | 9/1992 | Liu et al. | |
| 5,372,836 | 12/1994 | Imahashi | 438/5 |
| 5,432,122 | 7/1995 | Chae | 437/101 |
| 5,569,610 | 10/1996 | Zhang | 437/21 |

FOREIGN PATENT DOCUMENTS

| | | |
|---|---|---|
| 226478 | 7/1994 | China . |
| 241377 | 2/1995 | China . |
| 0 178 447 A2 | 4/1986 | European Pat. Off. . |
| 3-286518 | 3/1982 | Japan . |
| 4-124813 | 4/1992 | Japan . |
| 4-294523 | 10/1992 | Japan . |
| 5-55142 | 3/1993 | Japan . |
| 5-136048 | 6/1993 | Japan . |
| 5-175235 | 10/1993 | Japan . |
| 6-13311 | 1/1994 | Japan . |

OTHER PUBLICATIONS

Choi et al, *Extended Abstracts* (The 40th Spring Meeting, 1993); *The Japan Society of Applied Physics and Related Societies* (No. 2), 29a–SZT–6, "The Effects of Grain Boundary on Excimer–Laser–Crystallized Poly–Si TFT Characteristics" (month unavailable).

Shimizu, Extended Abstracts (The 53rd Autumn Meeting, 1992); The Japan Society of Applied Physics (No. 2), 17p–ZT–4, "Solid–Phase Crystallization of a–Si Films—Effect of SiO₂ Surface Condition . . . " (month unavailable).

Tsujimoto et al, Extended Abstracts (The 53rd Autumn Meeting, 1992); The Japan Society of Applied Physics (No. 2), 17p–ZT–7, "Effect of Surface–Roughness on External Seed Solid–Phase–Epitaxy of SOI Structure" (month unavailable).

Noguchi et al, Extended Abstracts (The 53rd Autumn Meeting, 1992); The Japan Society of Applied Physics (No. 2), 17p–ZT–11, "Compulsive Localized Nucleation of Grains in Silicon Film by Excimer Laser Annealing" (month unavailable).

(List continued on next page.)

*Primary Examiner*—John Niebling
*Assistant Examiner*—Michael S. Lebentritt
*Attorney, Agent, or Firm*—Nixon & Vanderhye PC

[57] ABSTRACT

In a substrate having an insulating surface in which an amorphous semiconductor film is deposited on the insulating surface, a predetermined under-heating portion of the amorphous semiconductor film is partially heated with a heating source emitting heating rays. While heating, the under-heating portion is shifted by moving the heating source or the substrate. Accordingly, the amorphous semiconductor film is sequentially heat-treated and polycrystallized. As the under-heating portion shifts, the polycrystallization sequentially proceeds using the already polycrystallized portion by irradiation with the heating rays, which is adjacent to the under-heating portion, as seed crystal. Thus, the growth condition of crystal grains is uniformly controlled in the shifting direction of the under-heating portion.

14 Claims, 8 Drawing Sheets

OTHER PUBLICATIONS

Moniwa et al, Extended Absracts (The 53rd Autumn Meeting, 1992); The Japan Society of Applied Physics (No. 2), 17p–ZT–5 "Nucleation–Site Controlled Seedless Solid Phase Epitaxy Utilizing Local Doping and Substrate Step–Structure" (month unavailable).

Makihara et al, Extended Abstracts (The 53rd Autumn Meeting, 1992); The Japan Society of Applied Physics (No. 2), 17p–ZT–3, "Effects of Selective Etching on Step–Induced Solid–Phase Crystallization of Amorphous Si" (month unavailable).

Matsumura, Proceedings of the 29th VLSI Forum Latest Poly–Si TFT Process Technology, not later than Mar., 1994, "Low–Temperature Formation of Polycrystalline Si Thin Film of a Large Grain Diameter by an Excimer Laser Crystallization Method" (month unavailable).

METHOD AND AN APPARATUS FOR FABRICATING A SEMICONDUCTOR DEVICE

BACKGROUND OF THE INVENTION

1. Field of the Invention

The present invention relates to a method and an apparatus for fabricating a semiconductor device. More specifically, the present invention relates to a method for fabricating a semiconductor device having a polycrystalline semiconductor film, used for fabricating a large-area semiconductor device such as an active matrix type liquid crystal display (LCD), and an apparatus for fabricating such a semiconductor device.

2. Description of the Related Art

At the fabrication of an n-type thin film transistor (TFT) by use of a polycrystalline semiconductor film, when grain boundaries of the polycrystalline semiconductor film are present in a channel region of the transistor, unpaired covalent electrons (dangling bonds) are inevitably present at the boundaries. This creates potential barriers acting to block the movement of electrons at the grain boundaries, reducing the mobility of electrons at the ON operation of the transistor. Moreover, since trap levels are produced near the grain boundaries, electrons flow via the trap levels at the OFF operation of the transistor, increasing the leak current at the OFF operation. These problems degrade the device property of the transistor.

Accordingly, in order to improve the device property of the transistor, it is desirable to reduce the number of grain boundaries in the channel region.

A study on the device property of transistors was reported at the 40th Spring Meeting, 1993, of the Japan Society of Applied Physics and Related Societies. In this study, in the case where a TFT is fabricated by use of a polycrystalline semiconductor film formed by growing grains in the direction parallel to the substrate surface (hereinafter, such a direction is referred to as the "substrate surface direction"), the device property of a transistor fabricated so that the grain growth direction is parallel to the transistor conduction direction and that of a transistor fabricated so that the former crosses the latter were compared (Extended Abstracts (The 40th Spring Meeting, 1993); The Japan Society of Applied Physics and Related Societies, No. 29a-SZT-6).

According to the above study, for an n-type TFT, when the transistor conduction direction is parallel to the grain growth direction, the mobility of electrons is several times as large as that when the former crosses the latter. As a result, when the grain growth direction crosses the transistor conduction direction and a current flows across the grain boundaries, the transistor is largely affected by the grain boundaries. On the other hand, when the grain growth direction and the transistor conduction direction is parallel to each other and a current flows along the grain boundaries, the transistor is not so largely affected by the grain boundaries.

Accordingly, an effect substantially similar to the effect obtained by reducing the number of grain boundaries in the channel region of the transistor can be obtained by forming a polycrystalline semiconductor film by growing grains in the substrate surface direction and forming a transistor in the polycrystalline semiconductor film so that the grain growth direction and the transistor conduction direction are parallel to each other. As a result, a TFT with good device properties can be formed.

Conventionally, the following methods are employed, for example, for growing a polycrystalline semiconductor film:

(1) The entire surface of a substrate on which an amorphous semiconductor film is deposited is irradiated with excimer laser light.

(2) The entire surface of a substrate on which an amorphous semiconductor film is deposited is disposed in a heat-treatment oven and is subject to a long-time heat treatment at about 600° C.

In the method (1) where the amorphous semiconductor film is polycrystallized by use of an excimer laser, a portion of the amorphous semiconductor layer which is irradiated with laser light is first melted by drastic heating by laser radiation and then subsequently polycrystallized. In this polycrystallization process using an excimer laser, it is possible to reduce the height of potential barriers blocking the movement of electrons at grain boundaries. Thus, a TFT having a high mobility of 100 cm$^2$/Vs or more can be fabricated comparatively easily.

In the method (2) where the entire surface of a substrate with an amorphous semiconductor film formed thereon is disposed in a heat-treatment oven so as to be heat-treated for polycrystallization, seed crystal is generated at random in the amorphous semiconductor film over the entire surface of the substrate. The polycrystallization proceeds using the seed crystal as a core. In this polycrystallization process, a core grain grows radially from the seed crystal as a center. The crystal growth continues until the boundary of the grain contacts another grain, and then stops even when the heat treatment is continued.

When TFTs are formed using a polycrystalline semiconductor film obtained by heat-treating an amorphous semiconductor film in an oven according to the conventional method (2), the device properties of the resultant TFTs on the same substrate surface are substantially uniform. The conventional method (2), however, has problems as follows: The shape of grains of the resultant polycrystalline semiconductor film has no directionality; it is difficult to control the number and the direction of grain boundaries in the channel region of the transistor; and it is difficult to reduce the height of potential barriers blocking the movement of carrier electrons at the grain boundaries. Accordingly, in the conventional method (2), it is difficult to form a TFT having a high mobility of 100 cm$^2$/Vs or more.

A study relating to the conventional method (2) was reported at the 53rd Autumn Meeting, 1992, of the Japan Society of Applied Physics. According to that study, the generation density of seed crystal in the heat-treatment of an amorphous semiconductor film (amorphous silicon film) can be lowered by treating the surface of an oxide film underlying the amorphous semiconductor film with an acidic solution prior to the formation of the amorphous semiconductor film, and thus a greater grain diameter at the completion of crystallization can be obtained (Extended Abstracts (The 53rd Autumn Meeting, 1992); The Japan Society of Applied Physics, No. 17p-ZT-4).

This technique can be applied to the fabrication of a large-area semiconductor device with the addition of only one wet-etching process but without requiring an additional masking process or film formation process. This technique is also effective in increasing the average grain diameter. However, when TFTs are-actually formed using a substrate polycrystallized by the above technique, since the number of crystal boundaries and the direction thereof present in the channel region of the transistor are not controllable, the device property of the resultant transistors varies. This variation in the device property becomes more serious when the average grain diameter is greater and thus the number of grain boundaries present in the channel region is smaller.

According to another report at the 53rd Autumn Meeting, 1992, of the Japan Society of Applied Physics, the heat treatment is performed at the state where a single crystalline semiconductor is crimped to an amorphous semiconductor film (amorphous silicon film) so as to polycrystallize the amorphous semiconductor film. By this treatment, the resultant grown grains have the same orientation as the single crystalline semiconductor (Extended Abstracts (The 53rd Autumn Meeting, 1992); The Japan Society of Applied Physics, No. 17p-ZT-7).

According to the above technique, the seed crystal for the polycrystallization of the amorphous semiconductor film is located outside the amorphous semiconductor film and the substrate on which the amorphous semiconductor film is formed. Therefore, it is not necessary to conduct additional processes such as drug treatment, formation of stepped portions, impurity doping, and laser radiation for the amorphous semiconductor film and the substrate themselves. However, in this technique, as in the previously described technique, the state of grains in the polycrystalline semiconductor film is not controllable. As a result, the device properties of the resultant transistors fabricated on the same substrate surface differ from one another.

In relation to the above problem on the control of grains, some studies were reported at the 53rd Autumn Meeting, 1992, of the Japan Society of Applied Physics, for realizing the polycrystallization of an amorphous semiconductor film under the control of the positions of grains, i.e., the positions of the start of crystal growth. These include the following:

(a) An amorphous semiconductor film (amorphous silicon film) is partially irradiated with excimer laser light, and then heat-treated so as to polycrystallize the amorphous semiconductor film using the portion irradiated with laser light as the center. In this way, grains are made larger and the position of the crystal growth is controlled. (Extended Abstracts (The 53rd Autumn Meeting, 1992); The Japan Society of Applied Physics, No. 17p-ZT-11)

(b) An amorphous semiconductor film is partially doped with phosphorus (P) ions, and then heat-treated, so that the amorphous semiconductor film can be selectively polycrystallized, starting from the P ion-doped portion thereof. (Extended Abstracts (The 53rd Autumn Meeting, 1992); The Japan Society of Applied Physics, No. 17p-ZT-5)

(c) A stepped portion is formed on an underlying substrate before the formation of an amorphous semiconductor film (amorphous silicon film), so that the amorphous semiconductor film can be polycrystallized, starting from this stepped portion. (Extended Abstracts (The 53rd Autumn Meeting, 1992); The Japan Society of Applied Physics, No. 17p-ZT-3)

When the above techniques are applied to the fabrication of a large-area semiconductor device, it is possible to control the positions of grains, i.e., the positions of crystal growth. Accordingly, grains can be selectively grown at positions where transistors are to be formed. It is thus possible to selectively grow crystal grains having a size large enough to form transistors. No problem will arise if portions other than those used for forming transistors are left in the amorphous state. Thus, according to these techniques, since polycrystalline semiconductor films having the required size can be formed at the required positions, the heat-treatment time can be shortened. This effect is greater if the device to be fabricated is smaller.

However, in order to fabricate a semiconductor device using a polycrystalline semiconductor film obtained by the above techniques, there still remain some problems to be overcome.

Techniques for selectively growing crystalline silicon at a predetermined position on a substrate are disclosed, for example, in Japanese Laid-Open Patent Publications No. 5-55142 and No. 5-136048. In the former Publication No. 5-55142, a silicon film is selectively doped with impurities as the core of crystal growth, and then heat-treated. In the latter Publication No. 5-1360481, grains as the core of crystal growth are sprayed into a silicon film, and then the silicon film is heat-treated.

In both of the above techniques, crystalline silicon can be grown at specific positions on the substrate. However, in either case, since the resultant crystal is a twin crystal, the device property of transistors to be fabricated varies depending on the positions of the transistors on the substrate due to defects which may be found in the crystal.

SUMMARY OF THE INVENTION

A method for fabricating a semiconductor device of this invention including the steps of: depositing an amorphous semiconductor film on a substrate having an insulating surface; and polycrystallizing the amorphous semiconductor film, wherein the step of polycrystallizing the amorphous semiconductor film includes the steps of: partially heating a predetermined under-heating portion on the substrate with the amorphous semiconductor film formed thereon with heating means; and shifting at least one of the heating means and the substrate, so as to shift the predetermined under-heating portion along the substrate surface.

In one embodiment, a heating light source for emitting heating light rays to irradiate a strip-shaped irradiation area is used as a heating source of the heating means, and in the step of polycrystallizing the amorphous semiconductor film, at least one of the heating means and the substrate is shifted so that the substrate is relatively shifted in a direction crossing the irradiation area, while the substrate is irradiated with the heating light rays on at least one side of the substrate.

In another embodiment, the heating light source is at least one lamp. Alternatively, the heating light source is at least one continuous wave laser.

In still another embodiment, a radiation energy density of the heating light rays is set in the range where the amorphous semiconductor film is not melted. Alternatively, a radiation energy density of the heating light rays is set in the range where the amorphous semiconductor film is melted but the polycrystallized semiconductor film is not melted.

In still another embodiment, the substrate is rectangular, and the method further includes the step of forming a strip-shaped doped portion in the amorphous semiconductor film in parallel with and along one side of the substrate by implanting at least one element selected from the group consisting of Ni, Cu, Pd, Pt, Co, Fe, Ag, Au, In, and Sn, after the step of depositing the amorphous semiconductor film and before the step of polycrystallizing the amorphous semiconductor film, and the polycrystallization of the amorphous semiconductor film is started from the doped portion.

In still another embodiment, the substrate is rectangular, and the method further includes the step of forming a strip-shaped doped portion in the amorphous semiconductor film in parallel with and along one side of the substrate by implanting at least one element selected from the V-group elements, after the step of depositing the amorphous semiconductor film and before the step of polycrystallizing the amorphous semiconductor film, and the polycrystallization of the amorphous semiconductor film is started from the doped portion.

In still another embodiment, the substrate is rectangular, and the method further includes the step of forming a stepped portion having a height of 100 nm or more on a surface of the substrate in parallel with and along one side of the substrate before the step of depositing the amorphous semiconductor film, the amorphous semiconductor film being also deposited over the stepped portion, and the polycrystallization of the amorphous semiconductor film is started from the stepped portion.

In still another embodiment, the substrate is rectangular, and the method further includes the step of forming a strip-shaped crimped portion by crimping a single crystalline semiconductor layer made of the same element as the amorphous semiconductor film to the amorphous semiconductor film in parallel with and along one side of the substrate, after the step of depositing the amorphous semiconductor film and before the step of polycrystallizing the amorphous semiconductor film, and the polycrystallization of the amorphous semiconductor film is started from the strip-shaped crimped portion.

In still another embodiment, the substrate is rectangular, and the method further includes the step of forming a strip-shaped crimped portion by crimping a polycrystalline semiconductor layer made of the same element as the amorphous semiconductor film to the amorphous semiconductor film so that the polycrystalline semiconductor layer overlaps the amorphous semiconductor film in a strip portion in parallel with and along one side of the substrate, after the step of depositing the amorphous semiconductor film and before the step of polycrystallizing the amorphous semiconductor film, and the polycrystallization of the amorphous semiconductor film is started from the strip-shape crimped portion.

In still another embodiment, the substrate is rectangular, and the method further includes the step of forming a strip-shaped polycrystallized portion on the amorphous semiconductor film by irradiating a predetermined strip portion of the amorphous semiconductor film in parallel with and along one side of the substrate with excimer laser beams, after the step of depositing the amorphous semiconductor film and before the step of polycrystallizing the amorphous semiconductor film, and the polycrystallization of the amorphous semiconductor film is started from the strip-shaped polycrystallized portion.

In still another embodiment, a shifting speed of the under-heating portion is set to be equal to or less than a value obtained by dividing a width of the under-heating portion by a time required from the start of the heating until the amorphous semiconductor is melted.

In still another embodiment, the amorphous semiconductor film is deposited by use of an apparatus selected from the group consisting of a plasma CVD apparatus, a low pressure CVD apparatus, and a sputtering apparatus.

In still another embodiment, a thickness of the amorphous semiconductor film is set in the range from 30 nm to 150 nm.

An apparatus for fabricating a semiconductor device of the present invention includes: heating means having at least one heating light source for heating a predetermined under-heating portion by emitting heating light rays for irradiating a strip-shaped irradiation area; and shifting means for shifting the under-heating portion along a surface of a substrate on which an amorphous semiconductor film is formed by shifting at least one of the substrate and the heating means so that the substrate is relatively shifted in a direction crossing the irradiation area, while the substrate is irradiated with the heating light rays on at least one side of the substrate, wherein the substrate is heat-treated for the polycrystallization of the amorphous semiconductor film.

Thus, the invention described herein makes possible the advantages of (1) providing a method for fabricating a semiconductor device capable of forming a good polycrystalline semiconductor film by controlling the grain growth direction, and the number and the position of grain boundaries in a polycrystalizing process of an amorphous semiconductor film, and (2) providing an apparatus for fabricating such a semiconductor device.

These and other advantages of the present invention will become apparent to those skilled in the art upon reading and understanding the following detailed description with reference to the accompanying figures.

DESCRIPTION OF THE PREFERRED EMBODIMENTS

The present invention will be described by way of examples with reference to the accompanying drawings.

EXAMPLE 1

Figure 1:
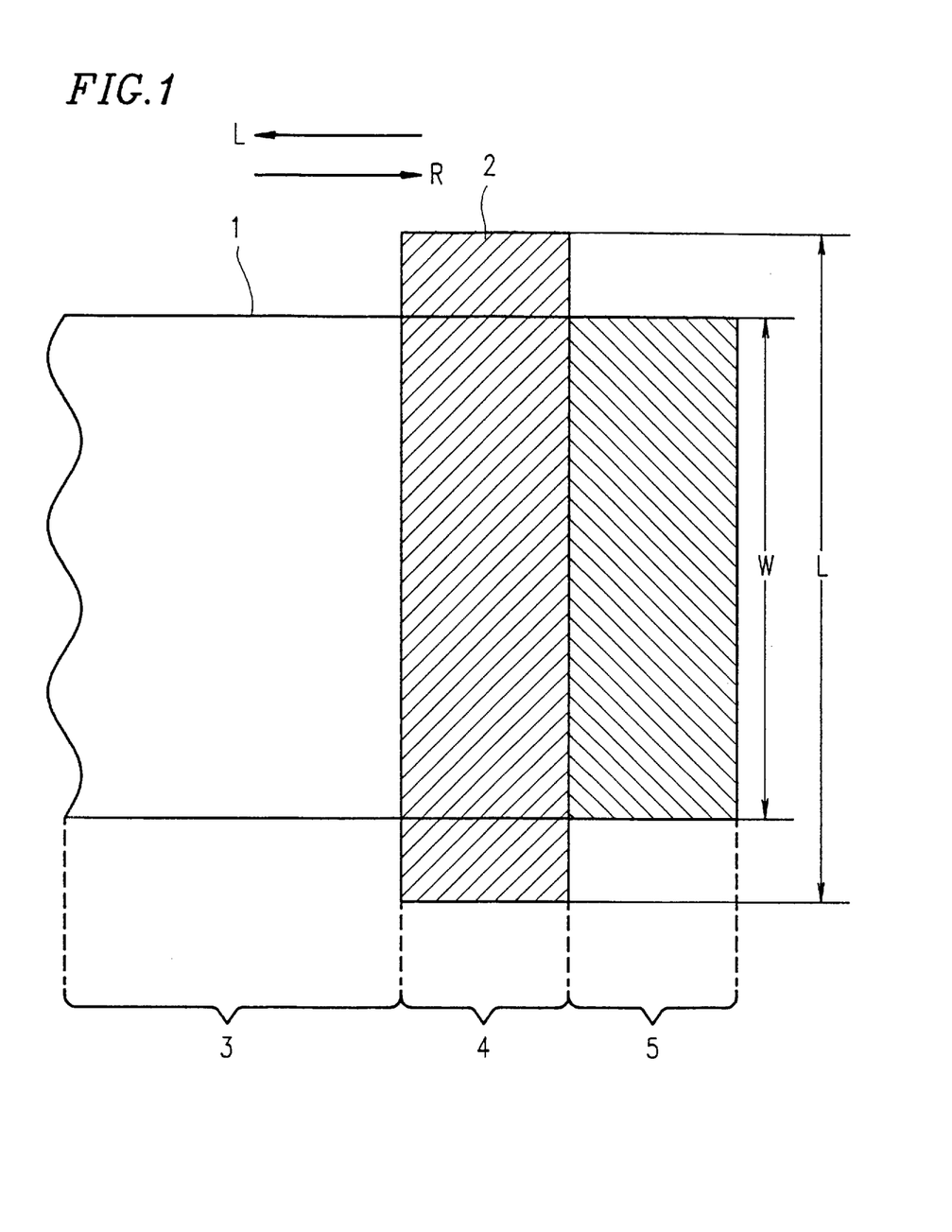
FIG. 1 is a schematic plan view of a substrate, for illustrating a partial heating step of an amorphous semiconductor film formed on the substrate in a polycrystallization process of a first example according to the present invention.

According to the present invention, an amorphous semiconductor film formed on a substrate is partially heated. This heating is sequentially shifted on the substrate, so as to gradually polycrystallize the amorphous semiconductor film. FIG. 1 is a schematic plan view as is viewed from above of the substrate, illustrating the partial heating step of the amorphous semiconductor film according to Example 1 of the present invention.

Referring to FIG. 1, an amorphous semiconductor film such as amorphous silicon (a-Si) film is deposited on a substrate 1 having an insulating surface (hereinafter, such a substrate having an insulating surface is simply referred to as a "substrate"). The amorphous semiconductor film may be directly deposited on the substrate 1, or it may be deposited on the substrate 1 via an insulating film such as $SiO_2$ interposed therebetween. The deposition of the amorphous semiconductor film may be performed by use of any one of a plasma CVD apparatus, a low pressure CVD apparatus, or a sputtering apparatus. Specifically, a film formation apparatus such as PE-CVD and LP-CVD, for example, is used.

The thickness of the amorphous semiconductor film is set in the range of 30–150 nm, preferably in the range of 50–100 nm. When the thickness is smaller than the above range, it is difficult to obtain grains having a large diameter at the polycrystallization. When the thickness is larger than the above range, the portion of the amorphous semiconductor film closer to the interface with the substrate may be left in the amorphous state without being polycrystallized, while the portion closer to the surface thereof is polycrystallized, during the polycrystallization process. It is therefore desirable to set the thickness of the amorphous semiconductor film within the above range.

The substrate 1 may be made of insulating material such as glass, or may be made of silicon or the like, with an insulating film made of $SiO_2$ or the like formed thereon.

The amorphous semiconductor film formed on the substrate 1 is partially heated by heat ray radiation. FIG. 1 shows the top surface of the substrate 1 where the partial heating process is in progress. As shown in FIG. 1, an irradiation area 2 is set so that the length L thereof is longer than the width W of the substrate 1 that is to be irradiated, so that the entire top surface of the substrate 1 can be efficiently heated by heat rays. The relationship between the length L of the irradiation area 2 and the width W of the substrate 1 is not limited to that shown in FIG. 1. For example, the length L and the width W may be equal to each other, or the former may be shorter than the latter.

In a heat treatment using heating light rays, the irradiation area 2 corresponds to the area irradiated with the heating light rays.

In this partial heating process, the substrate 1 is moved in the direction indicated by arrow R in FIG. 1, i.e., rightward as is viewed from the figure so as to cross the irradiation area 2 at a fixed position. Thus, as the substrate 1 passes the irradiation area 2, the amorphous semiconductor film on the substrate 1 is heated sequentially and polycrystallized. That is, a first portion 3 of the substrate 1 which is not yet heated corresponds to a portion where the semiconductor film on the substrate 1 is still amorphous. A second portion 4 corresponds to an under-heating portion where the amorphous semiconductor film is under heating. A third portion 5 corresponds to a portion where the heating has been completed and thus the amorphous semiconductor film has been polycrystallized.

Alternatively, the irradiation area 2 may be moved in a direction indicated by arrow L in FIG. 1, i.e., leftward as is viewed from the figure by moving a heat ray source in the same direction. Regardless of whether the substrate 1 or the heat ray source (i.e., the irradiation area 2) moves, the under-heating portion is gradually shifted, allowing the amorphous semiconductor film on the substrate 1 to be heated sequentially, and thus the polycrystallization proceeds.

Both the substrate 1 and the heat ray source may be moved, if required.

Hereinbelow, the concept on the polycrystallization as the under-heating portion of the amorphous semiconductor film is shifted will be described in detail.

When a semiconductor film is heated, it reaches its melting point and then melts. In general, the melting point when the semiconductor film is in the amorphous state is different from that when it is in the polycrystalline state.

For example, when the semiconductor film to be heated is silicon, the melting point of amorphous silicon is about 1200° C. and that of polysilicon is in the range of about 1600°–1700° C. Thus, there is a temperature difference of about 400°–500° C. between the different states of the silicon.

Accordingly, when the amorphous silicon and the polysilicon are placed adjacent to each other and gradually heated, the amorphous silicon melts first. This creates the state where the melted silicon and the polysilicon are adjacent to each other. Under this state, silicon crystal grows at edges of the crystal, i.e., at the periphery of the polysilicon. This phenomenon can be utilized for growing crystals. For example, crystals can be grown by contacting the surface of the melted silicon with a piece of single crystalline silicon as the seed crystal, so as to produce a single crystalline silicon column as a material for a silicon wafer.

According to the present invention, crystal is grown along the direction parallel to the surface of the semiconductor film (silicon film) based on the above principle. Specifically, the amorphous semiconductor portion (amorphous silicon portion) and the polycrystalline semiconductor portion (polysilicon portion) acting as the seed crystal are located adjacent to each other and heated simultaneously. By this heating, grains are grown from the polycrystalline semiconductor portion (polysilicon portion) acting as the seed crystal, so as to obtain a polycrystalline semiconductor film (polysilicon film) with large grains.

Semiconductor material applicable to the polycrystallization process involving the shifting of the under-heating portion according to the present invention is not limited to silicon.

Figure 2:
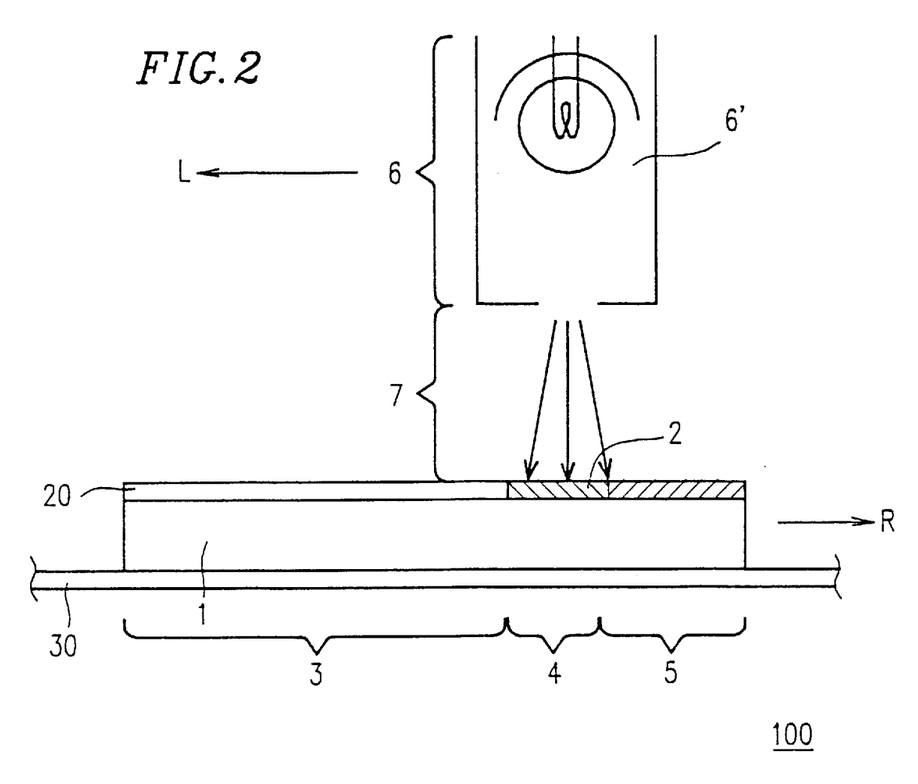
FIG. 2 is a sectional view of a substrate and a heat-treatment apparatus, for illustrating the partial heating step according to the present invention.

FIG. 2 is a sectional view of a heat-treatment apparatus 100 for performing the partial heating on the substrate 1 described above with reference to FIG. 1 and the substrate 1 under the heating.

The heat-treatment apparatus 100 has at least one heating light source 6 for irradiating the strip-shaped irradiation area 2. At the heating, the under-heating portion of the substrate 1 is sequentially shifted as previously described above. For the shifting, the substrate 1 is carried on a carrying apparatus 30, while the position of the heating light source 6 is fixed. The carrying apparatus 30 is moved in the direction of arrow R in FIG. 2, thus moving the substrate 1 to be irradiated in the same direction so as to cross the irradiation area 2. The substrate 1 is partially irradiated on one side thereof by heating light rays 7 emitted from the heating light source 6, sequentially starting from one end of the substrate 1 to the other end, when it crosses the irradiation area 2. The carrying apparatus 30 applicable is not limited to a specific type.

Alternatively, instead of mounting the substrate 1 on the carrying apparatus 30, the heating light source 6 may be attached to a suitable carrying apparatus. In this alternative case, while the position of the substrate 1 is fixed, the heating light source 6 is moved by moving the carrying apparatus (not shown in FIG. 2) in the direction of arrow L in FIG. 2, so as to move the irradiation area 2. By this operation, the substrate 1 relatively moves in the direction crossing the irradiation area 2. The carrying apparatus applicable to this alternative case is not limited to a specific type, either.

If required, both the substrate 1 and the heating light source 6 may be moved.

In FIG. 2, similarly in FIG. 1, the first portion 3 of the substrate 1 which is not yet heated corresponds to a portion where the semiconductor film (e.g., a silicon film) 20 on the substrate 1 is still amorphous. The second portion 4 corresponds to a portion where the amorphous semiconductor film 20 is under heating. The third portion 5 corresponds to a portion where the heating has been completed and thus the amorphous semiconductor film 20 has been polycrystallized.

The heating light source 6 includes a lamp 6' as shown in FIG. 2, or may include a continuous wave laser. specifically, a halogen lamp, a mercury lamp, and the like, or an argon laser, a $CO_2$ laser, and the like may be used. Thus, the crystallization is realized by melting the amorphous semiconductor film 20, and the height of potential barriers blocking carrier electrons at grain boundaries can be lowered.

The rate for cooling the portion heated by irradiation can be controlled by the speed for shifting the under-heating portion. Accordingly, by suitably controlling the shifting speed so that the cooling rate of the melted semiconductor film shows a moderate value, grains having a diameter of several microns or more can be grown so as to obtain a polycrystalline semiconductor film having a small density of grain boundaries.

The substrate 1 can be irradiated with continuous light by using the lamp 6' or the continuous wave laser for the heating light source 6. This minimizes the occurrence of variations in the heat radiated to and absorbed by the semiconductor film even when the irradiation area is shifted. As a result, the variation in the device property of TFTs formed on the same substrate surface can be minimized.

As described hereinbefore, as one of the conventional methods for fabricating a polycrystallized semiconductor film, an amorphous semiconductor film is irradiated with excimer laser light, so as to polycrystallize the semiconductor film. This conventional method using an excimer laser has the following disadvantages. Since a portion irradiated with excimer laser light is rapidly cooled at a rate in the order of nanoseconds (nsec), the grain diameter of the resultant polycrystalline semiconductor film is small. This was reported at the 29th VLSI Forum, Latest Poly-Si TFT Process Technology under the title of "Low-temperature formation of large-grain-diameter polysilicon TFT by excimer laser crystallization". Therefore, when a TFT is fabricated using a polycrystalline semiconductor film obtained by the above method, a number of grain boundaries are formed in the channel region of the transistor, preventing improvement in the device property of the transistor beyond a certain limit.

Another problem is that, only a rectangular area having a side of several millimeters can be covered by a one-shot radiation of the excimer laser. Thus, in order to fabricate a large-scale semiconductor device, the irradiation area by the excimer laser must be sequentially shifted on a large-scale substrate. However, since the excimer laser is a pulse wave laser, the laser light energy may vary with irradiation. As a result, the heat radiated to and absorbed by the amorphous semiconductor film varies in different portions due to the above-described shifting of the irradiation area. This may cause variations in the device property to arise on the resultant TFTs formed on the same substrate.

However, the above prior art problem is overcome by the present invention where an amorphous semiconductor film is partially heated using a lamp or a continuous wave laser as the heating light source and such a partial under-heating portion is gradually shifted, so as to be sequentially polycrystallized.

In the above method of the present invention, in order to ensure the polycrystallization so as to effectively obtain a high-quality polycrystalline film, the radiation energy density of the heating light rays 7 is preferably set in the range where the amorphous semiconductor film 20 is not melted, or in the range where the amorphous semiconductor film 20 is melted but the polycrystallized semiconductor film is not. This is due to the following reason: When a semiconductor film is heated under the state where amorphous portions and polycrystalline portions thereof are present in a mixed condition, the amorphous portions surrounding the grains are incorporated into the grains, and thus the crystal grows. Therefore, in order to obtain a large polycrystalline semiconductor film with Large grains, the above-mentioned range of radiation energy density is preferable.

It is also preferable to set the shifting speed of the irradiation area 2, i.e., the shifting speed of the substrate 1 or the heating light source 6 to be equal to, or less than the value obtained by dividing the width of the under-heating portion 4 by the time required from the start of the heating until the amorphous semiconductor is melted. By this setting of the shifting speed, the amorphous semiconductor film can be completely melted, and consequently no portion of the amorphous semiconductor film will be left unmelted. Thus, no crystal growth will occur at random using such an unmelted portion as the seed.

EXAMPLE 2

Figure 3A:
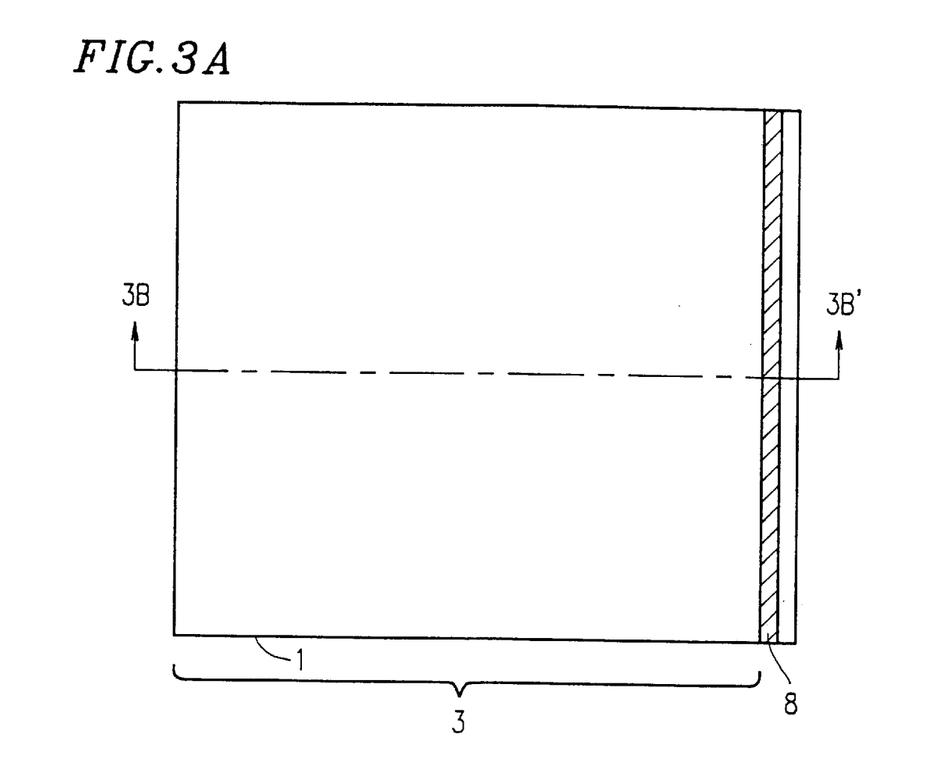
FIG. 3A is a plan view of a substrate on which an amorphous semiconductor film is formed for polycrystallization by a method of a second example according to the present invention.
Figure 3B:
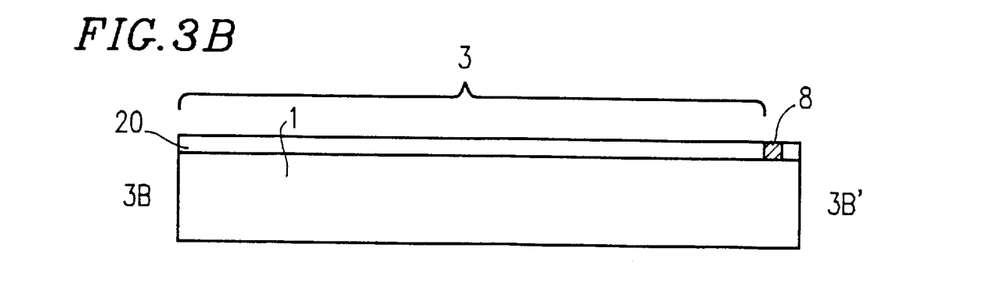
FIG. 3B is a sectional view taken along line 3B–3B' of FIG. 3A.

A second example of the present invention will be described with reference to FIGS. 3A and 3B. FIG. 3A is a plan view of a substrate 1 viewed from the surface thereof on which an amorphous semiconductor film 20 is formed for polycrystallization. FIG. 3B is a sectional view taken along line 3B–3B' of FIG. 3A.

In this example, an amorphous semiconductor is deposited on the rectangular substrate 1 shown in FIGS. 3A and 3B in the manner described in Example 1, so as to form an amorphous semiconductor film 20. Then, a strip-shaped portion 8 of the amorphous semiconductor film 20 along one side of the substrate 1 is doped with at least one impurity element selected from Ni, Cu, Pd, Pt, Co, Fe, Ag, Au, In, and Sn, so as to form a strip-shaped doped portion 8. In other words, the doped portion 8 is a portion doped with at least one impurity element selected from Ni, Cu, Pd, Pt, Co, Fe, Ag, Au, In, and Sn.

The heat-treatment method for the substrate 1, the heat-treatment apparatus and the heating light source to be used, and the features thereof are the same as those described in Example 1. Detailed description thereof is therefore omitted here.

In this example, the substrate L is heated from the side of 3B' to the side of 3B as shown in FIGS. 3A and 3B. By this heat treatment, the portion 3 of the amorphous semiconductor film 20 located on the 3B side of the doped portion 8 is polycrystallized, and then a semiconductor device is fabricated by using this polycrystallized semiconductor film.

Thus, in this example, the amorphous semiconductor film 20 is partially doped with at least one metal element selected from Ni, Cu, Pd, Pt, Co, Fe, Ag, Au, In, and Sn as an impurity element, and then heat-treated for polycrystallization as described in Example 1. The implanted metal impurities catalytically act to facilitate the crystal growth. Therefore, the portion where the concentration of the metal impurities is high (the doped portion 8 at the start of the growth) provides a starting point of the crystal growth. Grains easily grow outwardly from the high-concentration portion. As a result, a polycrystalline semiconductor film with a uniform crystal growth direction can be obtained over the entire surface of the substrate 1.

The portion where the concentration of metal impurities is high is gradually shifted on the substrate 1 together with the starting point of the crystal growth. Therefore, the concentration of metal impurities in the portion where the semiconductor device is to be fabricated can be reduced to a practically permissible level.

EXAMPLE 3

Figure 4A:
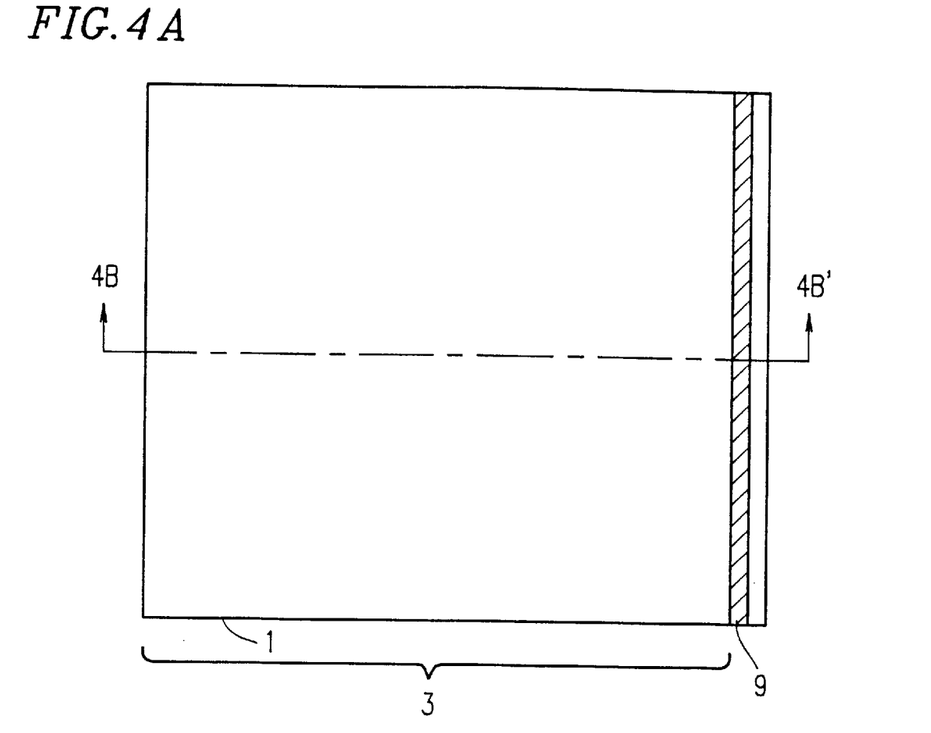
FIG. 4A is a plan view of a substrate on which an amorphous semiconductor film is formed for polycrystallization by a method of a third example according to the present invention.
Figure 4B:
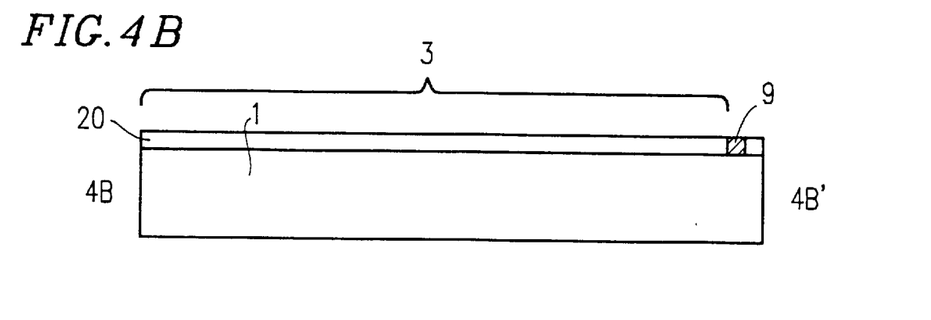
FIG. 4B is a sectional view taken along line 4B–4B' of FIG. 4A.

A third example of the present invention will be described with reference to FIGS. 4A and 4B. FIG. 4A is a plan view of a substrate 1 viewed from the surface thereof on which an amorphous semiconductor film 20 is formed for polycrystallization. FIG. 4B is a sectional view taken along line 4B–4B' of FIG. 4A.

In this example, an amorphous semiconductor is deposited on the rectangular substrate 1 shown in FIGS. 4A and 4B in a manner described in Example 1, so as to form an amorphous semiconductor film 20. Then, a strip-shaped portion 9 of the amorphous semiconductor film 20 along one side of the substrate 1 is doped with at least one impurity element selected from the V-group elements such as phosphorus (P), so as to form a strip-shaped doped portion 9. In other words, the doped portion 9 is a portion doped with at least one impurity element selected from the V-group elements.

The heat-treatment method for the substrate 1, the heat-treatment apparatus and the heating light source to be used, and the features thereof are the same as those described in Example 1. Detailed description thereof is therefore omitted here.

In this example, the substrate 1 is heated from the side of 4B' to the side of 4B as shown in FIGS. 4A and 4B. By this heat treatment, the portion 3 of the amorphous semiconductor film 20 located on the 4B side of the doped portion 9 is polycrystallized, and then a semiconductor device is fabricated by using this polycrystallized semiconductor film.

Thus, in this example, the amorphous semiconductor film 20 is partially doped with at least one metal element selected from the V-group elements as an impurity element, and then heat-treated for polycrystallization as described in Example 1. The implanted impurities catalytically act to facilitate the generation of seed crystals. Therefore, the doped portion 9 with V-group element impurities provides a starting point of the crystal growth. Grains easily grow outwardly from the doped portion 9. As a result, a polycrystalline semiconductor film with uniform crystal growth direction can be obtained over the entire surface of the substrate 1.

The technique where the starting point of crystal growth in a polycrystallization process is controlled by the selective implantation of a V-group element was described hereinbefore in relation to the description of the prior art. However, the effect of facilitating crystal growth in the prior art has been effective only when n-type impurities were implanted. Such an effect has not been obtained when p-type impurities are implanted. In other words, the effect of facilitating crystal growth in the prior art has depended on the type of conductivity of the impurities to be implanted. This indicates that this conventional technique is not directly applicable to the formation of p-type transistors, and therefore it is difficult to fabricate a semiconductor device having p-type transistors such as CMOS transistors on the substrate by this conventional technique.

On the other hand, according to the method of this example, V-group element impurities are implanted only for the purpose of facilitating the generation of seed crystal. The implanted V-group element impurities do not diffuse to the portion where a semiconductor device is to be fabricated. Thus, the above problem of the conventional technique is overcome.

EXAMPLE 4

Figure 5A:
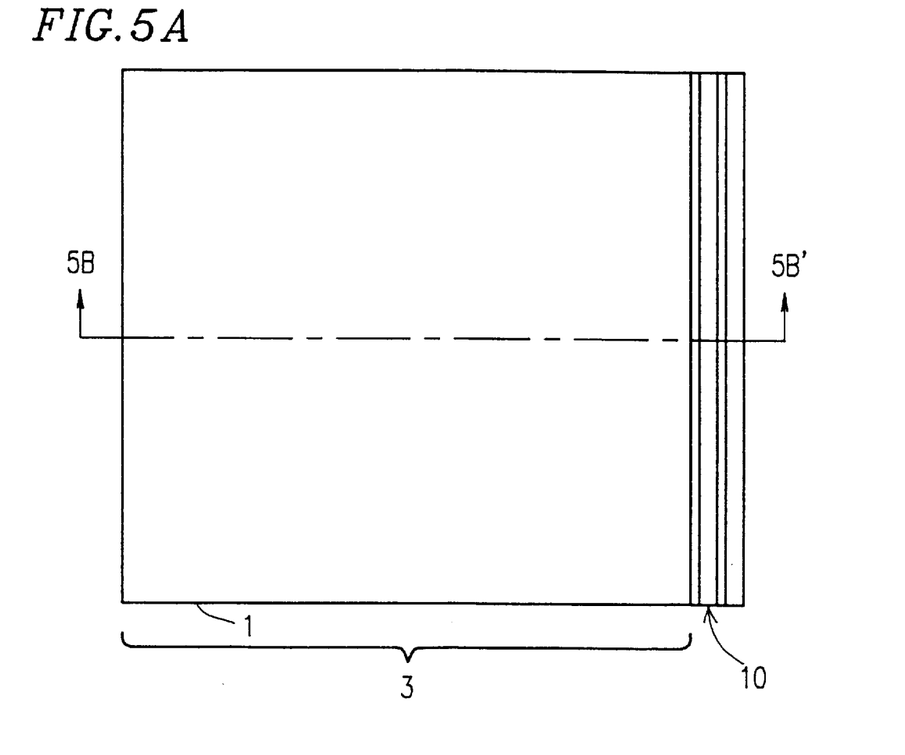
FIG. 5A is a plan view of a substrate on which an amorphous semiconductor film is formed for polycrystallization by a method of a fourth example according to the present invention.
Figure 5B:
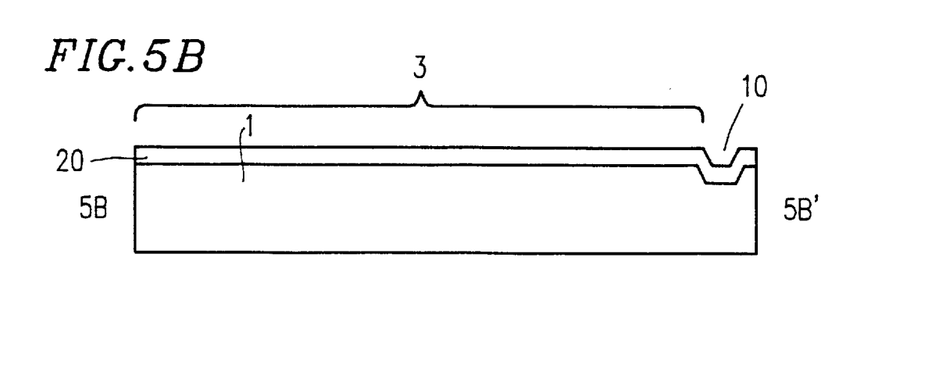
FIG. 5B is a sectional view taken along line 5B–5B' of FIG. 5A.

A fourth example of the present invention will be described with reference to FIGS. 5A and 5B. FIG. 5A is a plan view of a substrate 1 viewed from the surface thereof on which an amorphous semiconductor film 20 is formed for polycrystallization. FIG. 5B is a sectional view taken along line 5B–5B' of FIG. 5A.

In this example, a recess 10 having a depth of 100 nm or more is formed on the rectangular substrate 1 as shown in FIGS. 5A and 5B along one side of the substrate 1. Then, an amorphous semiconductor is deposited on the substrate 1 with the recess 10 in a manner described in Example 1, so as to form an amorphous semiconductor film 20.

The recess 10 may be formed directly on the surface of the substrate 1 by any appropriate method such as photolithography. Alternatively, the recess 10 may be formed by first forming a thin film having a thickness of about 100 nm on the surface of the substrate 1 and then patterning the thin film in order to form a groove therein by photolithography or the like, so as to obtain the recess 10 on the surface of the substrate 1.

The heat-treatment method for the substrate 1, the heat-treatment apparatus and the heating light source to be used, and the features thereof are the same as those described in Example 1. Detailed description thereof is therefore omitted here.

In this example, the substrate 1 is heated from the side of 5B' to the side of 5B shown in FIGS. 5A and 5B. By this heat treatment, the portion 3 of the amorphous semiconductor film 20 located on the 5B side of the recess 10 is polycrystallized, and then a semiconductor device is fabricated by using this polycrystallized semiconductor film.

Thus, in this example, the stepped portion, i.e., the recess 10 is formed along one side of the substrate 1. When the substrate 1 with the recess 10 is heat-treated for polycrystallization, the poly-crystallization is facilitated at the steps included in the recess 10. In this example, the polycrystal generated at the steps is utilized as the seed crystal.

The technique where a stepped portion is formed on a substrate which underlies an amorphous semiconductor film was described hereinbefore in relation to the description of the prior art. Since the polycrystallization proceeds in the direction away from the stepped portion, the crystal growth obtained by this technique has a directionality. Therefore, when a transistor is fabricated using the substrate having a polycrystalline semiconductor film formed by this technique, the existing condition of grain boundaries present in the channel region of the transistor can be controlled to some extent. Since the crystal growth of this technique does not include impurity implantation, this technique is applicable to a circuit configuration such as CMOS without an additional operation.

However, when the above conventional technique is to be applied to a large-area semiconductor device where transistors are formed over the entire surface of a substrate, stepped portions must be formed over the entire surface of the substrate. As the number of step portions on the substrate increase, this also increases the possibility of the disconnection of wiring for transmitting electric signals to the transistors and the like. Accordingly, it is not preferable to apply the conventional technique directly to the fabrication of a large-area semiconductor device.

However, according to the method of this example, it is not necessary to form stepped portions over the entire surface of the substrate 1. Thus, the above problem of the conventional technique is overcome.

In this example, the recess 10 is formed as the stepped portion having a recess section. However, insofar a stepped portion is formed, the section thereof is not limited to the shape of a recess. For example, in reverse of the one as shown in FIG. 5B, the stepped portion may have a convex section having a height of 100 nm or more formed along one side of the substrate 1.

EXAMPLE 5

Figure 6A:
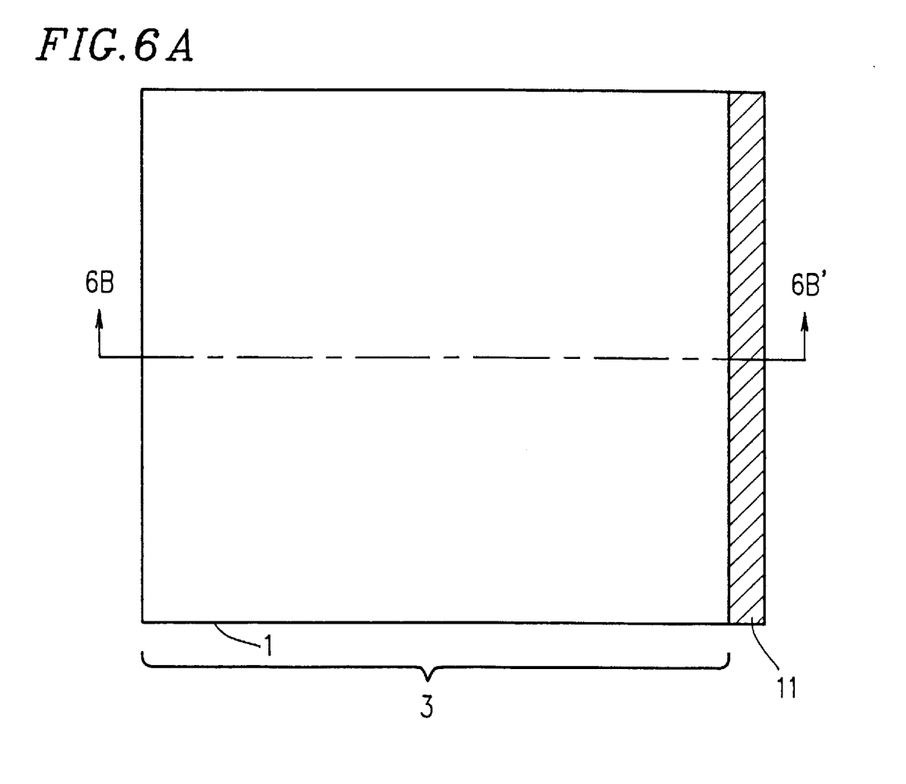
FIG. 6A is a plan view of a substrate on which an amorphous semiconductor film is formed for polycrystallization by a method of a fifth example according to the present invention.
Figure 6B:
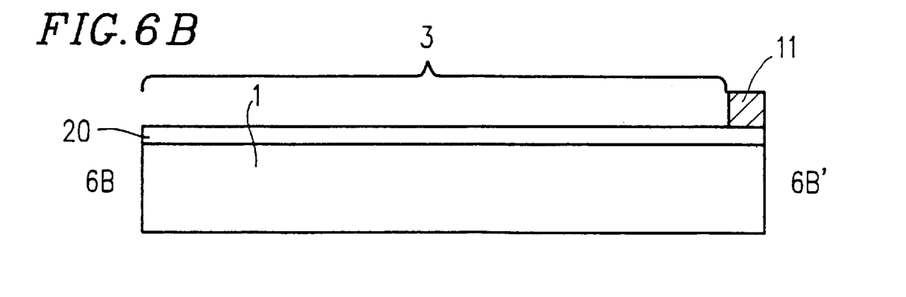
FIG. 6B is a sectional view taken along line 6B–6B' of FIG. 6A.

A fifth example of the present invention will be described with reference to FIGS. 6A and 6B. FIG. 6A is a plan view of a substrate 1 viewed from the surface thereof on which an amorphous semiconductor film 20 is formed for polycrystallization. FIG. 6B is a sectional view taken along line 6B–6B' of FIG. 6A.

In this example, an amorphous semiconductor is deposited on the rectangular substrate 1 shown in FIGS. 6A and 6B in a manner described in Example 1, so as to form an amorphous semiconductor film 20. Then, a strip-shaped single crystalline semiconductor layer 11 made of the same element as the amorphous semiconductor film 20 is crimped to the amorphous semiconductor film 20 along one side of the substrate 1.

The heat-treatment method for the substrate 1, the heat-treatment apparatus and the heating light source to be used, and the features thereof are the same as those described in Example 1. Detailed description thereof is therefore omitted here.

In this example, the substrate 1 is heated from the side of 6B' to the side of 6B as shown in FIGS. 6A and 6B. By this heat treatment, a portion 3 of the amorphous semiconductor film 20 located on the 6B side of the strip-shaped single crystalline semiconductor layer 11 is polycrystallized, and then a semiconductor device is fabricated by using this polycrystallized semiconductor film.

Thus, in this example, the single crystalline semiconductor layer 11 as the seed crystal is formed outside of the amorphous semiconductor film 20 that is to be polycrystallized. Then, the single crystalline semiconductor layer 11 crimped to the amorphous semiconductor film 20 is heat-treated, and the grains generated are utilized as the seed crystals at the polycrystallization of the amorphous semiconductor film 20.

When an amorphous semiconductor film is formed over the entire surface of a large substrate with a side of 300 mm or more, it is difficult to crimp a single crystalline semiconductor over the entire surface of the amorphous semiconductor film. According to this example, however, the strip-shaped single crystalline semiconductor layer 11 may be crimped only along one side of the substrate 1, eliminating the necessity of crimping the single crystalline semiconductor layer 11 over the entire surface of the substrate 1.

EXAMPLE 6

Figure 7A:
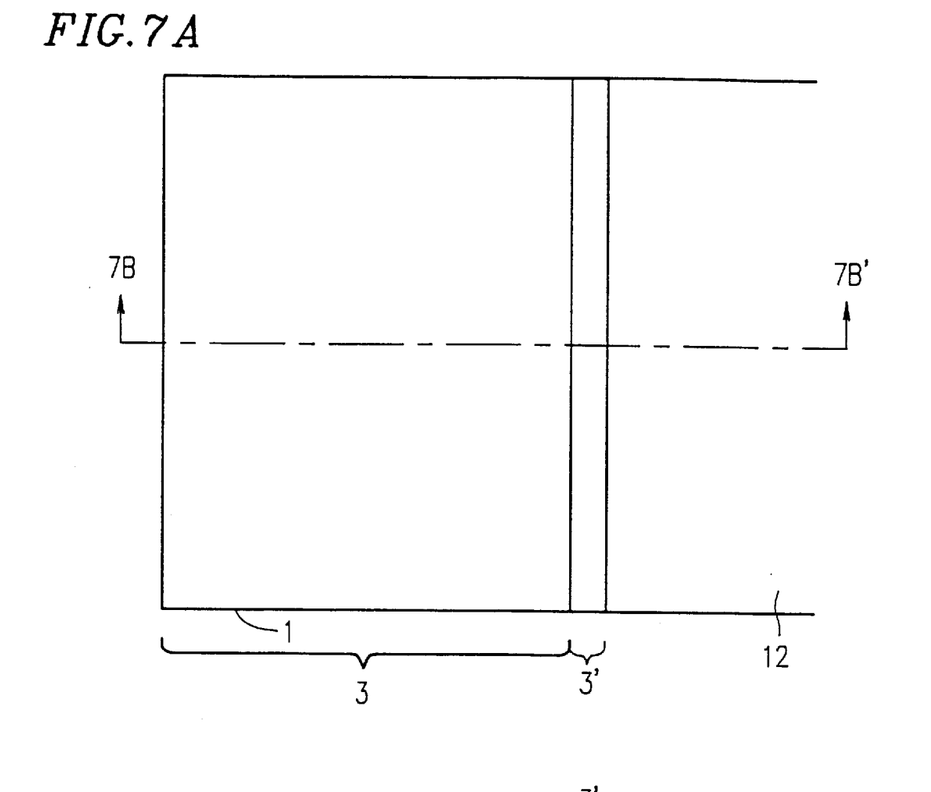
FIG. 7A is a plan view of a substrate on which an amorphous semiconductor film is formed for polycrystallization by a method of a sixth example according to the present invention.
Figure 7B:
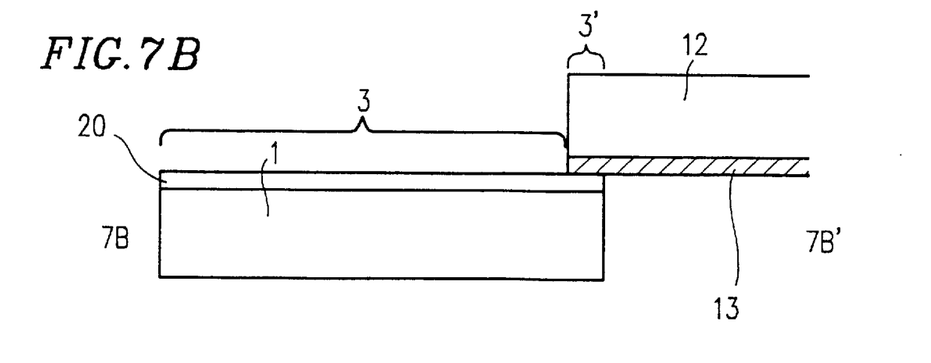
FIG. 7B is a sectional view taken along line 7B–7B' of FIG. 7A.

A sixth example of the present invention will be described with reference to FIGS. 7A and 7B. FIG. 7A is a plan view of a substrate 1 viewed from the surface thereof on which an amorphous semiconductor film 20 is formed for polycrystallization. FIG. 7B is a sectional view taken along line 7B–7B' of FIG. 7A.

In this example, an amorphous semiconductor is deposited on the rectangular substrate 1 shown in FIGS. 7A and 7B in a manner described in Example 1, so as to form an amorphous semiconductor film 20. Similarly, a polycrystalline semiconductor layer 13 made of the same element as the amorphous semiconductor film 20 is formed on a surface of another substrate 12. The substrates 1 and 12 are positioned facing each other so that the amorphous semiconductor film 20 and the polycrystalline semiconductor layer 13 overlap each other at a strip-shaped portion 3' along one side of the substrate 1, and the polycrystalline semiconductor layer 13 is crimped to the amorphous semiconductor film 20. The polycrystallization of the amorphous semiconductor film 20 is started from the portion 3' where the amorphous semiconductor film 20 and the polycrystalline semiconductor layer 13 are crimped to each other.

The heat-treatment method for the substrate 1, the heat-treatment apparatus and the heating light source to be used, and the features thereof are the same as those described in Example 1. Detailed description thereof is therefore omitted here. Moreover, a method for forming the amorphous semiconductor film 20 or the polycrystalline semiconductor film 13 is known in the semiconductor technology. Detailed description thereof is therefore omitted here.

In this example, the substrate 1 is heated from the side of 7B' to the side of 7B as shown in FIGS. 7A and 7B. By this heat treatment, a portion 3 of the amorphous semiconductor film 20 located on the 7B side of the strip-shaped portion 3' is polycrystallized, and then a semiconductor device is fabricated by use of this polycrystallized semiconductor film.

Thus, in this example, the polycrystalline semiconductor layer 13 used as the seed crystal is formed outside of the amorphous semiconductor film 20 that is to be polycrystallized. Then, the polycrystalline semiconductor layer 13 crimped to the amorphous semiconductor film 20 is heat-treated, and the grains generated are utilized as the seed crystal at the polycrystallization of the amorphous semiconductor film 20. According to this example, as in Example 5 where the single crystalline semiconductor layer is crimped, the polycrystalline semiconductor layer 13 may be crimped only along one side of the substrate 1, eliminating the necessity of crimping the polycrystalline semiconductor layer 13 over the entire surface of the substrate 1.

EXAMPLE 7

Figure 8A:
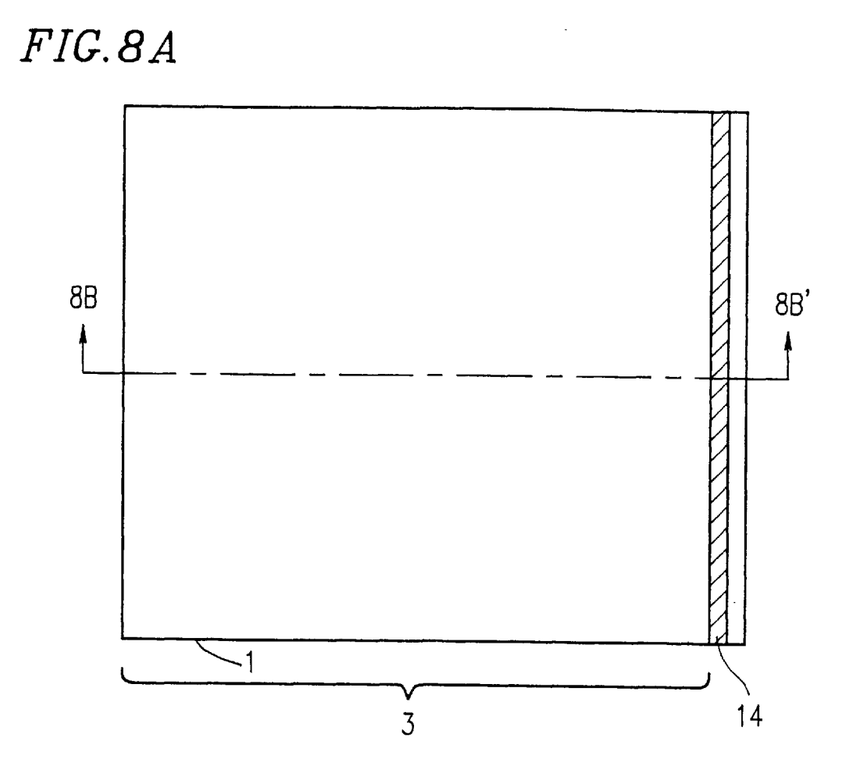
FIG. 8A is a plan view of a substrate on which an amorphous semiconductor film is formed for polycrystallization by a method of a seventh example according to the present invention.
Figure 8B:
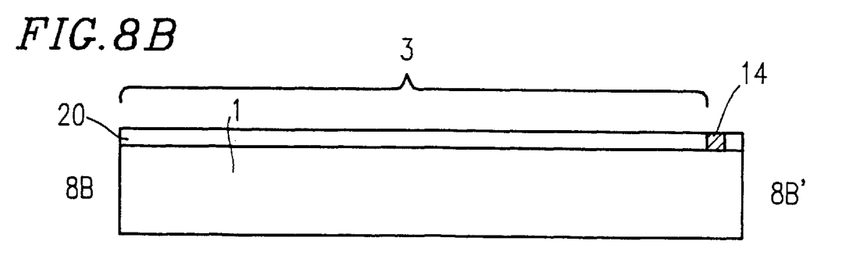
FIG. 8B is a sectional view taken along line 8B–8B' of FIG. 8A.

A seventh example of the present invention will be described with reference to FIGS. 8A and 8B. FIG. 8A is a plan view of a substrate 1 viewed from a surface thereof on which an amorphous semiconductor film 20 is formed for polycrystallization. FIG. 8B is a sectional view taken along line 8B–8B' of FIG. 8A.

In this example, an amorphous semiconductor is deposited on the rectangular substrate 1 shown in FIGS. 8A and 8B in a manner described in Example 1, so as to form an amorphous semiconductor film 20. Then, a strip-shaped portion 14 of the amorphous semiconductor film 20 along one side of the substrate 1 is irradiated with excimer laser light, so as to form a strip-shaped polycrystalline portion 14. In other words, the portion 14 is polycrystallized by the irradiation with excimer laser light.

The heat-treatment method for the substrate 1, the heat-treatment apparatus and the heating light source to be used, and the features thereof are the same as those described in Example 1. Detailed description thereof is therefore omitted here.

In this example, the substrate 1 is heated from the side of 8B' to the side of 8B as shown in FIGS. 8A and 8B. By this heat treatment, the portion 3 of the amorphous semiconductor film 20 located on the 8B side of the strip-shaped portion 14 is polycrystallized, and then a semiconductor device is fabricated by using this polycrystallized semiconductor film.

The technique where the amorphous semiconductor film is selectively polycrystallized by being irradiated with excimer laser light was described hereinbefore in relation with the description of the prior art.

However, in the case where ea group of image display elements and peripheral driving circuits are formed on the same substrate, a large-scale transistor having a channel width of 100 μm or more must be fabricated. In this case, it is difficult to form the entire large-scale transistor by one crystal grain using the conventional technique even if the selective crystal growth is performed starting from the above laser-irradiated portion as the center. Moreover, as already described in Example 1, there are problems arising from the fact that the portion irradiated with excimer laser light is rapidly cooled and that the range of the irradiation is narrow.

On the other hand, according to the method of this example, a strip-shaped portion 14 along one side of the substrate 1 is selectively irradiated with excimer laser light, so as to form the polycrystallized semiconductor portion 14. Only the polycrystalline semiconductor portion 14 used as the seed crystal is irradiated with excimer laser light. No irradiation with excimer laser light is required for the entire surface of the substrate. Thus, in the polycrystallization process according to this example, the problems of the conventional technique such as the small size of grains and the variation in the device property of the transistor are overcome.

Thus, by the polycrystallization of the amorphous semiconductor film as described in the above examples, the grain growth direction can be controlled and made uniform. Accordingly, by using the substrate having the polycrystallized semiconductor film, it becomes easy to fabricate a TFT so that the transistor conduction direction and the grain growth direction are parallel to each other. This minimizes the degradation of the device property of the transistor caused by grain boundaries present in the channel region of the transistor.

According to the present invention, the amorphous semiconductor film formed on the substrate is partially heated by shifting the under-heating portion of the amorphous semiconductor film. Accordingly, a grain can be grown in the direction of the shifting of the under-heating portion, using grains in the already heated and polycrystallized semiconductor portion, adjacent to the under-heating portion as the seed crystal. As a result, a good polycrystalline semiconductor film can be obtained. Further, by using a strip-shaped heating light source, the polycrystallization of the amorphous semiconductor film on the substrate can be easily performed.

The amorphous semiconductor film can be polycrystallized by melting the film with a lamp or a continuous wave laser as the heating light source. This lowers the height of potential barriers blocking the movement of carrier electrons at the grain boundaries. Further, the cooling rate of the heated portion can be controlled by the shifting speed of the under-heating portion. Accordingly, by suitably controlling the shifting speed of the under-heating portion so that the cooling of the melted semiconductor film can be slow, so each grain grows to a size as large as several microns or more, thus obtaining a polycrystalline semiconductor film having a small density of grain boundaries. Since continuous light is radiated, the heal radiated to and absorbed by the semiconductor surface does not vary with the shifting of the irradiation area, so the variation in the device property of the TFTs fabricated in the same substrate surface is minimized.

The amorphous semiconductor film may be doped with at least one metal element selected from Ni, Cu, Pd, Pt, Co, Fe, Ag, Au, In, and Sn as an impurity element, and then heated for polycrystallization. By this doping, the implanted metal impurities catalytically act to facilitate the crystal growth. Therefore, the portion where the concentration of the metal impurities is high provides a starting point of the crystal growth. Grains easily grow toward outside of the implanted portion. As a result, a polycrystalline semiconductor film with a uniform direction of crystal growth can be obtained over the entire surface of the substrate. Since the high-concentration portion shifts from the starting point of the crystal growth on the substrate, the concentration of metal impurities in the portion where the semiconductor device is to be fabricated can be lowered to a practically permissible level.

The amorphous semiconductor film may be doped with at least one element selected from the V-group elements such as phosphorus (P) as an impurity element, and then heated for polycrystallization. By this doping, the polycrystallization of the doped portion of the amorphous semiconductor film is facilitated. This doped portion can be therefore used as the seed crystal for crystal growth. Since the implantation of a V-group element is only for the purpose of facilitating the generation of seed crystal, the impurities are not diffused into the portion where a semiconductor device is to be fabricated.

A stepped portion may be formed on the underlying substrate along one side thereof and then the amorphous semiconductor film is heated for polycrystallization. By this formation of the stepped portion, the polycrystallization can be facilitated at the stepped portion. Since the polycrystal generated at the stepped portion is used only as the seed crystal, it is not necessary to form stepped portions over the entire surface of the substrate.

A strip-shaped single crystalline layer or a polycrystalline layer may be crimped to the amorphous semiconductor film along one side of the substrate. In such cases, a semiconductor layer acting as the seed crystal is formed outside of the amorphous semiconductor film that is to be polycrystallized. It is not necessary to crimp the single crystalline semiconductor layer or the polycrystalline semiconductor layer over the entire surface of the substrate, but the seed crystal may be selectively formed only on a portion of the amorphous semiconductor film.

The amorphous semiconductor film may be irradiated with excimer laser light along one side of the substrate, so as to form a polycrystalline semiconductor portion functioning as the seed crystal at the polycrystallization. Since the thus-formed polycrystalline semiconductor portion is used only as the seed crystal, it is not necessary to irradiate the entire surface of the amorphous semiconductor film as in the conventional polycrystallization process using the excimer laser radiation. Further, the problems such as the small size of grains and the variation in the device property of the transistor can be prevented.

The radiation energy density may be in the range where the amorphous semiconductor film is not melted, or in the range where the amorphous semiconductor film is melted but the polycrystallized semiconductor film is not melted. By this setting, the polycrystallization with high efficiency and high quality can be performed.

The shifting speed of the under-heating portion determined by the shifting speed of the substrate or the heating source may be set to be equal to or less than the value obtained by dividing the width of the under-heating portion by the time required from the start of the heating until the amorphous semiconductor is melted. By this setting, the polycrystallization with high efficiency and high quality can also be performed.

The amorphous semiconductor film can be easily formed by use of any one of a plasma CVD apparatus, a low pressure CVD apparatus, or a sputtering apparatus. By setting the thickness of the amorphous semiconductor film in the range of 30–150 nm, good polycrystallization can be realized.

Thus, a substrate having a good-quality polycrystalline semiconductor film formed thereon can be provided by polycrystallizing an amorphous semiconductor film by the use of the method and/or the apparatus for fabricating a semiconductor device according to the present invention. By using the above substrate, for example, for fabricating an active matrix type liquid crystal image display device having TFTs as nonlinear devices, it is possible to manufacture a driver-monolithic liquid crystal image display device having a uniform image display property on the same substrate surface. Such a driver-monolithic type device greatly reduces the manufacturing cost.

Semiconductor material applicable to the polycrystallization process involving the shifting of the under-heating portion according to the present invention is not limited to silicon exemplified in the above explanation.

Various other modifications will be apparent to and can be readily made by those skilled in the art without departing from the scope and spirit of this invention. Accordingly, it is not intended that the scope of the claims appended hereto be limited to the description as set forth herein, but; rather that the claims be broadly construed.

What is claimed is:

1. A method for fabricating a semiconductor device, comprising the steps of:

depositing an amorphous semiconductor film on a substrate having an insulating surface; and polycrystallizing the amorphous semiconductor film to obtain a polycrstallized semiconductor, wherein the step of polycrystallizing the amorphous semiconductor film includes the steps of:

heating an under-heating portion on the substrate with the amorphous semiconductor film formed thereon with a heating source;

setting a shifting speed in such a range that a temperature of the under-heating portion becomes equal to or higher than a melting temperature of the amorphous semiconductor but lower than a melting temperature of the polycrystallized semiconductor, by setting the shifting speed to be equal to or less than a value obtained by dividing a width of the under-heating portion by a time required from the start of the heating until the temperature of the under-heating portion reaches the melting temperature of the amorphous semiconductor; and shifting at least one of the heating source and the substrate at the shifting speed so as to shift the under-heating portion along the substrate surface, wherein during the heating step, the amorphous semiconductor and the already-polycrystallized semiconductor are located adjacent each other within the under-heating portion so as to be simultaneously heated, and polycrystallization proceeds from an edge of the already-polycrystallized semiconductor.

2. A method according to claim 1, wherein the heating light source emits heating light rays to irradiate a strip-shaped irradiation area, and in the step of polycrystallizing the amorphous semiconductor film, at least one of the heating source and the substrate is shifted so that the substrate is relatively shifted in a direction crossing the irradiation area, while the substrate is irradiated with the heating light rays on at least one side of the substrate.

3. A method according to claim 2, wherein the heating light source is at least one lamp.

4. A method according to claim 2, wherein the heating light source is at least one continuous wave laser.

5. A method according to claim 2, wherein a radiation energy density of the heating light rays is set in the range where the amorphous semiconductor film is melted but the polycrystallized semiconductor film is not melted.

6. A method according to claim 1, wherein the substrate is rectangular, the method further comprises the step of forming a strip-shaped doped portion in the amorphous semiconductor film in parallel with and along one side of the substrate by implanting at least one element selected from the group consisting of Ni, Cu, Pd, Pt, Co, Fe, Ag, Au, In, and Sn, after the step of depositing the amorphous semiconductor film and before the step of polycrystallizing the amorphous semiconductor film, and the polycrystallization of the amorphous semiconductor film is started from the doped portion.

7. A method according to claim 1, wherein the substrate is rectangular, the method further comprises the step of forming a strip-shaped doped portion in the amorphous semiconductor film in parallel with and along one side of the substrate by implanting at least one element selected from the V-group elements, after the step of depositing the amorphous semiconductor film and before the step of polycrystallizing the amorphous semiconductor film, and the polycrystallization of the amorphous semiconductor film is started from the doped portion.

8. A method according to claim 1, wherein the substrate is rectangular, the method further comprises the step of forming a stepped portion having a height of 100 nm or more on a surface of the substrate in parallel with and along one side of the substrate before the step of depositing the amorphous semiconductor film, the amorphous semiconductor film being also deposited over the stepped portion, and the polycrystallization of the amorphous semiconductor film is started from the stepped portion.

9. A method according to claim 1, wherein the substrate is rectangular, the method further comprises the step of forming a strip-shaped crimped portion by crimping a single crystalline semiconductor layer made of the same element as the amorphous semiconductor film to the amorphous semiconductor film in parallel with and along one side of the substrate, after the step of depositing the amorphous semiconductor film and before the step of polycrystallizing the amorphous semiconductor film, and the polycrystallization of the amorphous semiconductor film is started from the strip-shaped crimped portion.

10. A method according to claim 1, wherein the substrate is rectangular, the method further comprises the step of forming a strip-shaped crimped portion by crimping a polycrystalline semiconductor layer made of the same element as the amorphous semiconductor film to the amorphous semiconductor film so that the polycrystalline semiconductor layer overlaps the amorphous semiconductor film in a strip portion in parallel wiLth and along one side of the substrate, after the step of depositing the amorphous semiconductor film and before the step of polycrystallizing the amorphous semiconductor film, and the polycrystallization of the amorphous semiconductor film is started from the strip-shape crimped portion.

11. A method according to claim 1, wherein the substrate is rectangular, the method further comprises the step of forming a strip-shaped polycrystallized portion on the amorphous semiconductor film by irradiating a predetermined strip portion of the amorphous semiconductor film in parallel with and along one side of the substrate with excimer laser beams, after the step of depositing the amorphous semiconductor film and before the step of polycrystallizing the amorphous semiconductor film, and the polycrystallization of the amorphous semiconductor film is started from the strip-shaped polycrystallized portion.

12. A method according to claim 1, wherein the amorphous semiconductor film is deposited by use of an apparatus selected from the group consisting of a plasma CVD apparatus, a low pressure CVD apparatus, and a sputtering apparatus.

13. A method according to claim 1, wherein a thickness of the amorphous semiconductor film is set in the range from 30 nm to 150 nm.

14. A method according to claim 1, wherein at least one of the heating source and the substrate is sequentially shifted.

* * * * *